US012787455B2

(12) United States Patent
Tao et al.

(10) Patent No.: US 12,787,455 B2
(45) Date of Patent: *Nov. 3, 2026

(54) METHOD FOR MANUFACTURING PHOTOVOLTAIC MODULE AND PHOTOVOLTAIC MODULE

(71) Applicants: JINKO SOLAR CO., LTD., Jiangxi (CN); ZHEJIANG JINKO SOLAR CO., LTD., Haining (CN)

(72) Inventors: Wusong Tao, Jiangxi (CN); Jun Feng, Jiangxi (CN); Yufan Zhan, Jiangxi (CN); Yunfeng Han, Jiangxi (CN)

(73) Assignees: JINKO SOLAR CO., LTD, Jiangxi (CN); ZHEJIANG JINKO SOLAR CO., LTD., Haining (CN)

( * ) Notice: Subject to any disclaimer, the term of this patent is extended or adjusted under 35 U.S.C. 154(b) by 57 days.

This patent is subject to a terminal disclaimer.

(21) Appl. No.: 18/972,683

(22) Filed: Dec. 6, 2024

(65) Prior Publication Data

US 2025/0107267 A1 Mar. 27, 2025

Related U.S. Application Data

(63) Continuation of application No. 18/359,724, filed on Jul. 26, 2023, now Pat. No. 12,237,434.

(30) Foreign Application Priority Data

Apr. 19, 2023 (CN) ......................... 202310423939.8

(51) Int. Cl.
*H10F 71/00* (2025.01)
*H10F 19/80* (2025.01)
*H10F 19/90* (2025.01)

(52) U.S. Cl.
CPC ............. *H10F 71/00* (2025.01); *H10F 19/90* (2025.01); *H10F 19/80* (2025.01); *H10F 19/904* (2025.01)

(58) Field of Classification Search
CPC ................................. H10F 71/00; H10F 19/90
See application file for complete search history.

(56) References Cited

U.S. PATENT DOCUMENTS 12,237,434 B2 * 2/2025 Tao ......................... H10F 19/80
2022/0406951 A1 * 12/2022 Chen ....................... H10F 19/00

FOREIGN PATENT DOCUMENTS

CN 109786492 A 5/2019
CN 111755549 A 10/2020
(Continued)

OTHER PUBLICATIONS

Jinko Solar Co., Ltd. et al., China First Examination Report with English Translation, CN 202310423939.8, Apr. 4, 2025, 12 pgs.
(Continued)

*Primary Examiner* — Lindsey A Buck
(74) *Attorney, Agent, or Firm* — USCH Law, PC

(57) ABSTRACT

Embodiments of the disclosure provide a method for manufacturing a photovoltaic module, including: providing at least one cell string, an end portion of each cell overlaps with an end portion of an adjacent cell to form a corresponding overlapping welding region; for each overlapping welding region, forming a film insertion opening between stacked end portions of the two adjacent cells forming the each overlapping welding region; providing at least one film strip, and inserting a part of each film strip into a corresponding film insertion opening, such that a width of the part of the each film strip inserted into the corresponding film insertion opening is larger than a width of the remaining part of the each film strip; and closing each film insertion opening.

20 Claims, 9 Drawing Sheets

(56) References Cited

FOREIGN PATENT DOCUMENTS

| | | | | |
|---|---|---|---|---|
| CN | 112038434 | A | 12/2020 | |
| CN | 112397611 | A | 2/2021 | |
| CN | 112864265 | A | 5/2021 | |
| CN | 113013274 | A | 6/2021 | |
| CN | 213782028 | U | 7/2021 | |
| CN | 215070013 | U | 12/2021 | |
| CN | 216793706 | U | 6/2022 | |
| CN | 217098104 | U | 8/2022 | |
| CN | 115881842 | A | 3/2023 | |
| WO | 2019232974 | A1 | 12/2019 | |
| WO | 2020177530 | A1 | 9/2020 | |
| WO | WO-2021258576 | A1 * | 12/2021 | ......... H10F 71/1375 |
| WO | 2022262163 | A1 | 12/2022 | |

OTHER PUBLICATIONS

Jinko Solar Co., Ltd et al., China Notice of Grant with English Translation, CN 202310423939.8, May 5, 2025, 12 pgs.

Jinko Solar Co., Ltd., et al., Non-Final Rejection, U.S. Appl. No. 18/359,724, filed Apr. 24, 2024, 12 pgs.

Jinko Solar Co., Ltd., et al., Extended European Search Report, EP 23192969.6, Jan. 25, 2024, 9 pgs.

* cited by examiner

METHOD FOR MANUFACTURING PHOTOVOLTAIC MODULE AND PHOTOVOLTAIC MODULE

CROSS REFERENCE TO RELATED APPLICATIONS

The present application is a continuation of U.S. patent application Ser. No. 18/359,724, filed on Jul. 26, 2023, which claims the benefit of priority under the Paris Convention to Chinese Patent Application No. 202310423939.8 filed on Apr. 19, 2023, each of which is incorporated herein by reference in its entirety.

TECHNICAL FIELD

The various embodiments described in this document relate in general to solar cells, and more specifically to a method for manufacturing a photovoltaic module and a photovoltaic module.

BACKGROUND

Photovoltaic modules, also called solar panels, generate electricity through the "photovoltaic effect". Tiling ribbon (TR) technology, as a new assembly method, greatly shortens a cell gap, realizes high energy density and increases the power of module by performing micro-spacing "overlapping" and welding on adjacent cells.

During laminating of the photovoltaic module, in order to reduce extrusion stress between the overlapped adjacent cells, it is necessary to insert a film strip in an overlapping welding region of the adjacent cells, and the film strip is located between the adjacent cells corresponding to the overlapping welding region, which can provide buffering effect for the cells during laminating of the photovoltaic module and improve the problem that the cells are prone to crack.

However, at present, cracking of the cells is easy to occur during insertion of films between adjacent cells corresponding to the overlapping welding region.

SUMMARY

Embodiments of the disclosure provide a method for manufacturing a photovoltaic module and a photovoltaic module.

Embodiments of the disclosure provide a method for manufacturing a photovoltaic module, including: providing at least one cell string, where a respective cell string of the at least one cell string includes N cells arranged in sequence along a same direction, an end portion of each cell is stacked with an end portion of an adjacent cell, such that each two adjacent cells form a corresponding overlapping welding region, N being greater than 1; for each overlapping welding region, forming a film insertion opening between stacked end portions of the two adjacent cells corresponding to the each overlapping welding region; providing at least one film strip, and inserting a part of each film strip into a corresponding film insertion opening, with a remaining part of the each film strip exposed outside the corresponding film insertion opening; moving the at least one cell string relative to the at least one film strip, such that the remaining part of the each film strip is at least partially inserted into the corresponding film insertion opening; and closing the film insertion openings so that each of the at least one film strip is inserted between the two adjacent cells of the corresponding overlapping welding region.

In some embodiments, providing at least one cell string includes: forming a plurality of cell strings sequentially arranged along a preset direction, and for each overlapping welding region of the respective cell string of the plurality of cell strings, forming the film insertion opening between the stacked end portions of the two adjacent cells corresponding to the each overlapping welding region. Providing the at least one film strip includes: providing a plurality of film strips, where the plurality of film strips are inserted into different film insertion openings of the respective cell string respectively, and each film strip extends along the preset direction, and inserting each film strip into a corresponding film insertion opening of the respective cell string of the plurality of cell strings, where each film strip of the plurality of film strips corresponds to one of overlapping welding regions in the respective cell string.

In some embodiments, the plurality of cell strings include first sub-cell strings and second sub-cell strings that are alternately arranged along the preset direction, where a first cell to a N-th cell in each of the first sub-cell strings are sequentially arranged along a first direction, and a first cell to a N-th cell in each of the second sub-cell strings are sequentially arranged along a second direction, and the first direction is opposite to the second direction; where inserting each film strip into a corresponding film insertion opening of the respective cell string of the plurality of cell strings includes: prior to forming the corresponding film insertion opening, offsetting each second sub-cell string of the second sub-cell strings in the second direction relative to each first sub-cell string of the first sub-cell strings; providing the plurality of film strips, where each film strip of the plurality of film strips includes first portions and second portions, each first portion corresponds to one first sub-cell string, and each second portion corresponds to one second sub-cell string, where each first portion includes a first segment and a second segment arranged along the first direction, and each second portion includes a third segment and a fourth segment arranged along the first direction; inserting each second segment into one film insertion opening of a corresponding first sub-cell string, with each first segment being exposed outside the one film insertion opening, and inserting each third segment into one film insertion opening of a corresponding second sub-cell string, with each fourth segment being exposed outside the one film insertion opening; and moving each first sub-cell string of the first sub-cell strings relative to each film strip of the plurality of film strips in the second direction such that at least part of each first segment is inserted into the one film insertion opening, and moving each second sub-cell string of the second sub-cell strings relative to each film strip in the first direction such that at least part of each fourth segment is inserted into the one film insertion opening, where the first sub-cell strings and the second sub-cell strings are aligned in the preset direction.

In some embodiments, an offset amount of each second sub-cell string relative to each first sub-cell string in the second direction is a first offset amount, a movement amount of each first sub-cell string relative to each film strip in the second direction is a first displacement amount, a movement amount of each second sub-cell string relative to each film strip in the first direction is a second displacement amount, and a sum of the first displacement amount and the second displacement amount is equal to the first offset amount.

In some embodiments, the first displacement amount is equal to the second displacement amount.

In some embodiments, moving each first sub-cell string relative to each film strip in the second direction and moving each second sub-cell string relative to each film strip in the first direction includes: fixing each film strip; and moving each cell of the cells of each first sub-cell string in the second direction by the first displacement amount, and moving each cell of the cells of each second sub-cell string in the first direction by the second displacement amount.

In some embodiments, offsetting each second sub-cell string in the second direction relative to each first sub-cell string includes: forming the first sub-cell strings and the second sub-cell strings that are alternately arranged along the preset direction, where the first sub-cell strings and the second sub-cell strings are aligned in the preset direction; and moving each second sub-cell string relative to each first sub-cell string in the second direction such that each second sub-cell string is offset by the first offset amount relative to each first sub-cell string in the second direction; or moving each first sub-cell string relative to each second sub-cell string in the first direction such that each second sub-cell string is offset by the first offset amount relative to each first sub-cell string in the second direction; or moving each second sub-cell string in the second direction with respect to each first sub-cell string by a first sub-offset amount and moving each first sub-cell string in the first direction with respect to each second sub-cell string by a second sub-offset amount, where a sum of the first sub-offset amount and the second sub-offset amount is equal to the first offset amount.

In some embodiments, a first cell to a N-th cell of each of two adjacent cell strings in the plurality of cell strings are sequentially arranged along the first direction, and the two adjacent cell strings are aligned along the preset direction, where inserting each film strip into a corresponding film insertion opening of the respective cell string of the plurality of cell strings includes: providing the plurality of film strips, where each film strip of the plurality of film strips includes a third portion and a fourth portion that are arranged along the first direction, the third portion and the fourth portion both extending along the preset direction; inserting the fourth portion of each film strip into a corresponding film insertion opening of each cell string in the plurality of cell strings, with the third portion of each film strip being exposed outside the corresponding film insertion opening; and moving each cell string in a second direction relative to each film strip such that at least a part of the third portion of each film strip is inserted into the corresponding film insertion opening.

In some embodiments, the remaining part of the each film strip being at least partially inserted into the corresponding film insertion opening includes: inserting the whole remaining part of the each film strip into the corresponding film insertion opening; or inserting part of the remaining part of the each film strip into the corresponding film insertion opening.

In some embodiments, after moving the at least one cell string relative to the at least one film strip, an orthographic projection of each film strip on a corresponding cell coincides with a corresponding overlapping welding region.

In some embodiments, inserting each film strip into a corresponding film insertion opening of the respective cell string of the plurality of cell strings includes: placing each film strip on each of the plurality of cell strings, where each film strip extends along the preset direction, and each film strip is directly located above a corresponding film insertion opening in each cell string; stretching two ends of each film strip in the preset direction along a direction away from each other, lowering each film strip, and inserting each film strip into the corresponding film insertion opening; and moving the end portion of each cell in each cell string and the end portion of an adjacent cell in a direction close to each other to close the corresponding film insertion opening, where each film strip inserted in the corresponding film insertion opening is positioned between two adjacent cells of the corresponding overlapping welding region.

In some embodiments, each film insertion opening is kept open during moving of each cell string relative to each film strip.

In some embodiments, an opening angle of each film insertion opening is in a range of 15° to 30°.

In some embodiments, during inserting of the part of each film strip into the corresponding film insertion opening, a ratio of a width of the part of each film strip inserted into the corresponding film insertion opening to a width of the remaining part of each film strip exposed on the cell outside the corresponding film insertion opening is in a range of 1:5 to 5:1.

Embodiments of the disclosure provide a photovoltaic module. The photovoltaic module includes at least one cell string, wherein a respective cell string of the at least one cell string includes N cells arranged in sequence along a same direction, wherein an end portion of each cell of the N cells is stacked with an end portion of an adjacent cell, such that each two adjacent cells form a corresponding overlapping welding region, N being greater than 1; the at least one film strip provided by using the method described above, wherein each film strip of the at least one film strip corresponds to one overlapping welding region of the respective cell string; a plurality of encapsulation layers, wherein each encapsulation layer is configured to cover a surface of the respective cell string; and a plurality of cover plate, wherein each cover plate is configured to cover a surface of a corresponding encapsulation layer away from the at least one cell string.

BRIEF DESCRIPTION OF THE DRAWINGS

One or more embodiments are illustrated by the figures in the corresponding drawings, which are not to be limiting to the embodiments, and the figures in the drawings are not to be limiting to scale unless specifically stated.

DETAILED DESCRIPTION OF THE EMBODIMENTS

It can be seen from existing technologies that cracking is easy to occur during inserting of film into photovoltaic modules.

It is found that one of reasons why cracking is easy to occur during film insertion of photovoltaic modules is that before film insertion, it is necessary to open corresponding end portions corresponding to overlapping welding regions of adjacent cells to form film insertion openings. In this operation, it is generally necessary to raise one end portion of a cell. If the film insertion opening is larger, the end portion of the cell needs to be raised higher, which may lead to uneven stress between the unraised end portion and the raised end portion of the cell, thereby leading to crack.

Embodiments of the disclosure provide a method for film insertion of a method for manufacturing a photovoltaic module. During film insertion, each film strip is partially inserted into a film insertion opening, so that the film insertion opening can be smaller than a film insertion opening into which each film strip is completely inserted. Therefore, in an operation of forming the film insertion opening, an opening degree of each of the end portions of the adjacent cells is relatively small, which is beneficial to reducing cracking of the cells in the process of opening the cells. After film insertion, the cell string is moved relative to the film strip, so that an exposed film strip can be inserted into the overlapping welding region, a width of the film strip inserted into the overlapping welding region is increased, and the buffering capacity of the film strip to the overlapping welding regions is improved. In addition, by adopting a manner of moving the cell string, the remaining part of each film strip can be inserted into the film insertion opening without increasing the opening between the cells corresponding to the overlapping welding regions again, such that cracking of the cells may be avoided.

The embodiments of the disclosure will be described in detail below with reference to the accompanying drawings. However, those of ordinary skill in the art can understand that, in various embodiments of the disclosure, many technical details are set forth in order to provide the reader with a better understanding of the disclosure. However, the technical solutions claimed in the disclosure may be realized even without these technical details and various changes and modifications based on the following embodiments.

Figure 1:
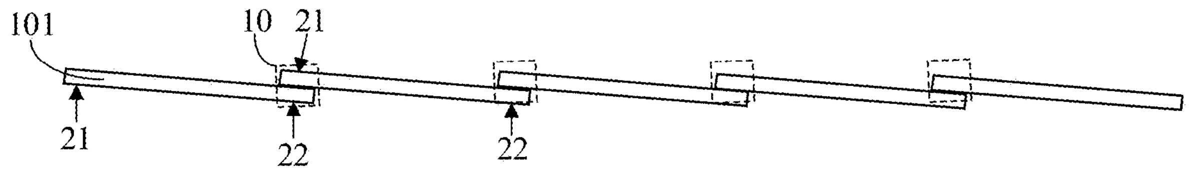
FIG. 1 is a cross-sectional structural view of a cell string provided in a method for film insertion of a method for manufacturing a photovoltaic module according to embodiments of the disclosure.
Figure 2:
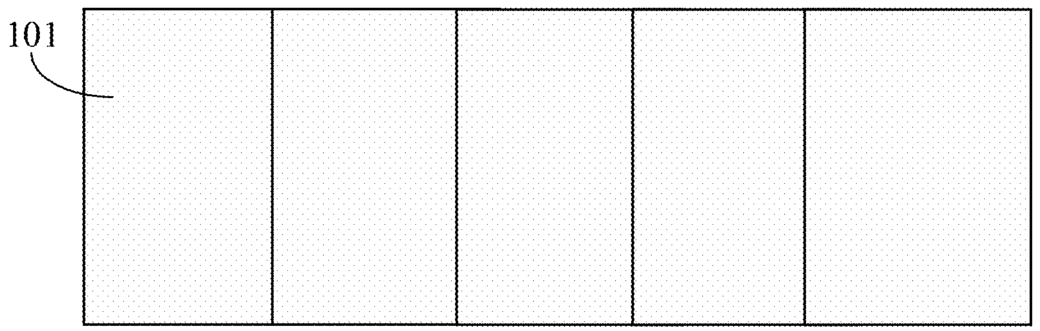
FIG. 2 is a schematic top view of a cell string provided in a method for film insertion of a method for manufacturing a photovoltaic module according to embodiments of the disclosure.

FIG. 1 is a cross-sectional structural view of a cell string provided in a method for film insertion of a method for manufacturing a photovoltaic module according to embodiments of the disclosure. FIG. 2 is a schematic top view of a cell string provided in a method for film insertion of a method for manufacturing a photovoltaic module according to embodiments of the disclosure.

Referring to FIG. 1 and FIG. 2, a method for film insertion of a method for manufacturing a photovoltaic module includes the following. At least one cell string is provided. Each cell string includes N cells arranged in sequence along a same direction. In some embodiments, an end portion of each cell 101 of the N cells 101 is stacked with an end portion of an adjacent cell 101, so that each two adjacent cells form a corresponding overlapping welding region 10, N being greater than 1.

The cell 101 is configured to absorb photons in the incident light and generate electron-hole pairs, and the electron-hole pairs are separated by a built-in electric field in the cell 101 to generate electric potential at both ends of a PN junction, thereby converting light energy into electric energy. In some embodiments, one surface of each cell 101 serves as a light-receiving surface and is used for absorbing incident light. In other embodiments, both surfaces of each cell 101 serve as light-receiving surfaces and are used for absorbing incident light. In some embodiments, each cell 101 may be a crystalline silicon solar cell, such as a monocrystalline silicon solar cell, or a polysilicon solar cell. It could be understood that, in some embodiments, the cells 101 may be electrically connected in multiple slices (e.g., ½ equal slice, ⅓ equal slice, ¼ equal slice, etc.) to form multiple cell strings, and the multiple cell strings are electrically connected in series and/or in parallel. In a particular example, the cells 101 are electrically connected in the form of ½ equal slices i.e., half-cells. The half-cells are obtained by cutting one cell in half.

In two adjacent cells 101, the end portion of one cell 101 is stacked with the end portion of the other cell 101, so that the number of cells 101 in the photovoltaic module per unit area is larger, thereby increasing the assembly density of the photovoltaic module and being beneficial to improving the module power.

It can be understood that each cell of the N cells 101 may have a first end portion 21 and a second end portion 22 opposite to the first end portion 21. The first end portion 21 of a n-th cell of the N cells arranged in sequence is stacked with the second end portion 22 of a (n-1)-th cell 101, $1<n\leq N$. In other words, the first end portion 21 of a second cell 101 of the N cells arranged in sequence is stacked with the second end portion 22 of a first cell 101, the first end portion 21 of a third cell 101 is stacked with the second end portion 22 of the second cell 101, and subsequent cells 101 arranged in sequence are stacked in the above manner until the first end portion 21 of a N-th cell is stacked with the second end portion 22 of a (N-1)-th cell 101.

In some embodiments, a side edge corresponding to the first end portion 21 of the cell 101 may be a non-cutting edge, i.e., may have at least one chamfer, and a side edge corresponding to the second end portion 22 may be a cutting edge, i.e., may not have a chamfer. In some embodiments, the side edge corresponding to the first end portion 21 of the cell 101 may also be a cutting edge and the side edge corresponding to the second end portion 22 may be a non-cutting edge.

In some embodiments, because a thickness of the cells corresponding to the overlapping welding region 10 is large during laminating of the photovoltaic module, the overlapping welding region 10 is first subjected to lamination, and a lamination stress of the cell 101 corresponding to the overlapping welding region 10 is also large. Under the large lamination stress, the cell 101 corresponding to the overlapping welding region 10 may crack. A film strip is inserted between the cells 101 corresponding to the overlapping welding region 10, so that the film strip plays a buffering role, which can relieve the lamination stress and further reduce the risk of cracking of the cells 101.

Figure 3:
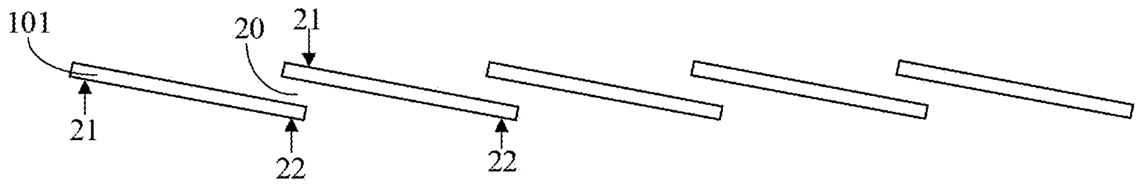
FIG. 3 is a cross-sectional view of a structure corresponding to an operation of forming a film insertion opening in a method for film insertion of a method for manufacturing a photovoltaic module according to embodiments of the disclosure.

FIG. 3 is a cross-sectional view of a structure corresponding to an operation of forming a film insertion opening in a method for film insertion of a method for manufacturing a photovoltaic module according to embodiments of the disclosure. The film insertion opening is formed as follows.

Referring to FIG. 3, an end portion of each cell 101 and an end portion of an adjacent cell 101 in a respective cell string are first opened to form a film insertion opening 20 between end portions of two adjacent cells 101. In some embodiments, since the first end portion 21 of the n-th cell is stacked with the second end portion 22 of the (n-1)-th cell 101, the first end portion 21 of each cell 101 can be raised to form film insertion openings 20 between the first end portion 21 of one cell 101 of each two adjacent cells 101 and the second end portion 22 of the other cell 101. In some embodiments, the first end portion 21 of each cell 101 may be adsorbed and fixed by a vacuum adsorption device, and then the first end portion 21 is raised to form a gap between the first end portion 21 of one cell 101 corresponding to the overlapping welding region 10 and the second end portion 22 of the other cell 101, so as to form film insertion openings 20.

In some embodiments, an opening angle of each film insertion opening 20 is in a range of 15° to 30°, for example, may be in a range of 15° to 20°, 20° to 25°, or 25° to 30°. In the above range, the opening angle of the film insertion opening 20 is relatively small, the first end portion 21 of the cell 101 does not need to be raised too high, such that cracking of the cell 101 in the operation of forming the film insertion opening 20 due to the first end portion 21 of the cell 101 being raised too high can be avoided. The opening angle of the film insertion opening 20 herein refers to an angle between an end portion of one cell 101 and an end portion of an adjacent cell 101 for forming each film insertion opening 20.

In some embodiments, the opening angle of the film insertion opening 20 may also be less than 15°, or greater than 30°. For example, the opening angle of the film insertion opening 20 is 10°, 13°, 35°, 40°, or 45°. The film insertion opening may not be set too narrow. If the film insertion opening is set too narrow, the difficulty of inserting the film strip into the film insertion opening may be increased. The film insertion opening may not be set too large, to reduce the risk of cracking in the operation of forming the film insertion opening. By setting the film insertion opening in the above angle range, the risk of cracking of the cell can be reduced to a certain extent.

In some embodiments, a suction cup may be arranged on the surface of the first end portion 21 of each cell 101, and a cavity may be arranged inside the suction cup. By using a communication device to communicate the cavity inside the suction cup with a vacuum pump, the cavity can be vacuumized to adsorb and fix the first end portion 21 of the cell 101, and then the first end portion 21 of the cell 101 is raised to form the film insertion opening 20.

Figure 4:
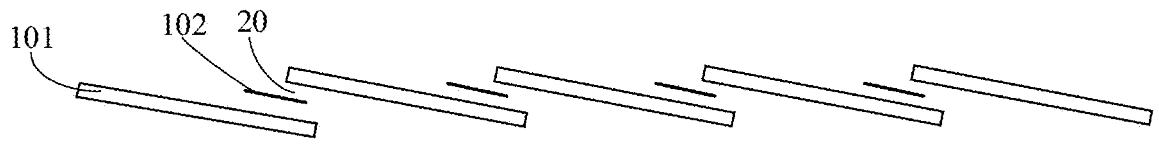
FIG. 4 is a cross-sectional view of a structure corresponding to an operation of inserting a part of a film strip into a film insertion opening in a method for film insertion of a method for manufacturing a photovoltaic module according to embodiments of the disclosure.
Figure 5:
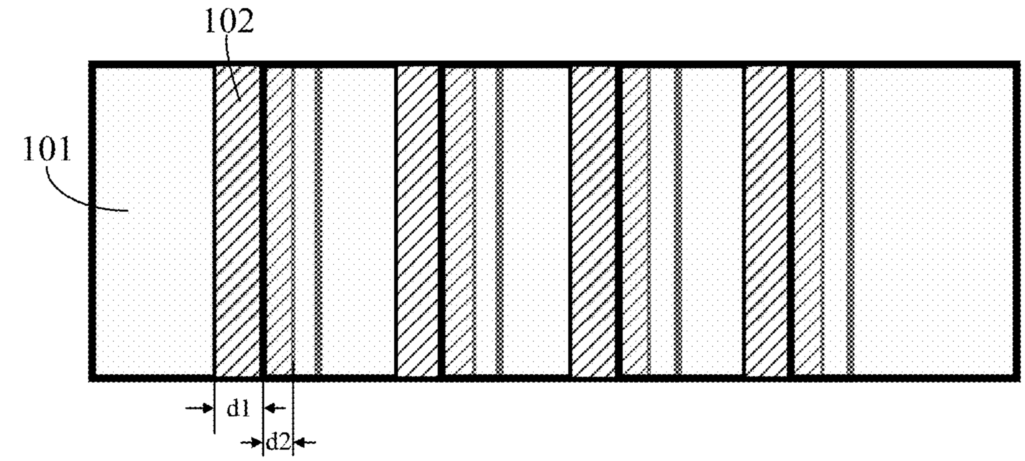
FIG. 5 is a schematic top view of a structure corresponding to an operation of inserting a part of a film strip into a film insertion opening in a method for film insertion of a method for manufacturing a photovoltaic module according to embodiments of the disclosure.

FIG. 4 is a cross-sectional view of a structure corresponding to an operation of inserting a part of a film strip into a film insertion opening 20 in a method for film insertion of a method for manufacturing a photovoltaic module according to embodiments of the disclosure. FIG. 5 is a schematic top view of a structure corresponding to an operation of inserting a part of a film strip into a film insertion opening 20 in a method for film insertion of a method for manufacturing a photovoltaic module according to embodiments of the disclosure.

Referring to FIGS. 4 and 5, at least one film strip 102 is provided. A part of each film strip 102 is inserted into a corresponding film insertion opening 20, and a remaining part of each film strip 102 is exposed on the cell 101 outside the corresponding film insertion opening 20. In some embodiments, the film strip 102 has a first side and a second side opposite to the first side in a width direction (e.g., an arrangement direction of the cell). An arrangement direction of the first side and the second side is the same as an arrangement direction of the first end portion 21 and the second end portion 22 of the cell 101. The second side of each film strip 102 is inserted into the corresponding film insertion opening 20, and the first side of each film strip 102 is remained outside the corresponding film insertion opening 20. That is, in the operation of inserting of the film strip, each film strip 102 is not completely inserted into the corresponding film insertion opening 20, so that a width of the film strip 102 inserted into the film insertion opening 20 is relatively small. Therefore, the formed film insertion opening 20 does not need to be too large, thereby reducing the height of the first end portion 21 raised, and preventing the problem that the first end portion 21 and the second end portion 22 are not uniformly stressed due to the fact that the first end portion 21 of the cell 101 is raised too high relative to the second end portion 22. As such, cracking of the cell 101 during forming of the film insertion opening 20 can be avoided.

Referring to FIG. 5, in the operation of inserting the part of each film strip 102 into the corresponding film insertion opening 20, a ratio of a width d2 of the part of each film strip 102 inserted into the corresponding film insertion opening to a width d1 of another part of each film strip exposed on the cell outside the corresponding film insertion opening 20 is in a range of 1:5 to 5:1, for example, is in a range of 1:5 to 1:4.5, 1:4.5 to 1:3.5, 1:3.5 to 1:1.3, 1:3 to 1:2, 1:2 to 1:1, 1:1 to 1.5:1, 1.5:1 to 2:1, 2:1 to 2.5:1, 2.5:1 to 3:1, 3:1 to 4:1, 4:1 to 4.5:1, or 4.5:1 to 5:1. In the above range, on one hand, the width of the part of each film strip 102 inserted into the corresponding film insertion opening 20 in the operation of inserting of film strips is not too small, and in order to insert the remaining part of each film strip 102 exposed outside the corresponding film insertion opening 20 into the corresponding film insertion opening, during moving of the respective cell string, the movement amount of the respective cell string is small, so that the arrangement of the cells in the cell string is prevented from being damaged due to the excessive movement amount of the cell string during moving of the respective cell string. On the other hand, the width of the part of each film strip 102 inserted into the corresponding film insertion opening 20 in the operation of inserting of film strips is not too large, which enables the opening angle of the formed film insertion opening 20 to be small and reduces the risk of cracking of the cells.

In some embodiments, the provided film strip 102 needs to be cut in advance. In some embodiments, the film strip 102 of the desired length may be obtained by cutting the film strip 102 drawn out of a film strip roll by a film cutting apparatus. Thereafter, two ends of the film strip 102 obtained after cutting are clamped by a clamping device, the film strip 102 is moved on the cell 101 corresponding to the film insertion opening 20, the two ends (e.g., in the preset direction described in the following text) of the film strip 102 are stretched in a direction away from each other to straighten the film strip 102, and then the film strip 102 is inserted into the film insertion opening 20.

Figure 6:
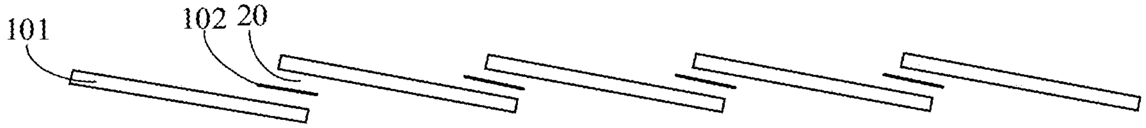
FIG. 6 is a cross-sectional view of a structure corresponding to an operation of moving a cell string relative to the film strip in a method for film insertion of a method for manufacturing a photovoltaic module according to embodiments of the disclosure.
Figure 7:
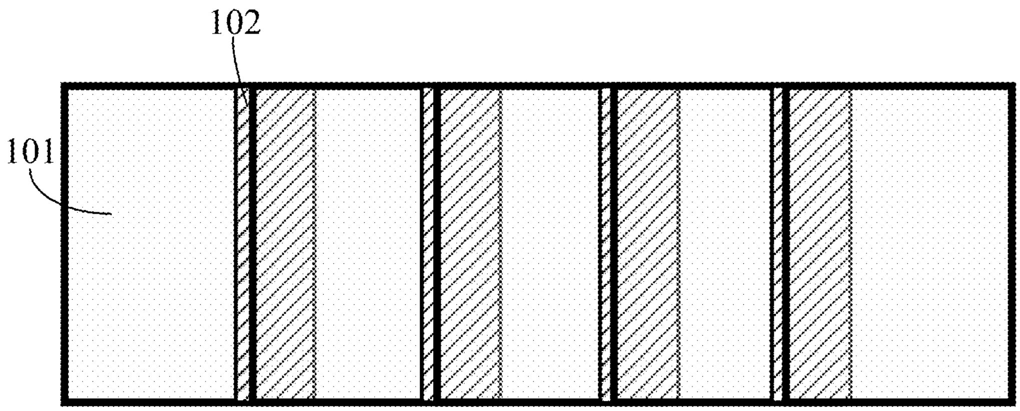
FIG. 7 is a schematic top view of a structure corresponding to an operation of moving a cell string relative to the film strip in a method for film insertion of a method for manufacturing a photovoltaic module according to embodiments of the disclosure.

FIG. 6 is a cross-sectional view of a structure corresponding to an operation of moving a cell string relative to the film strip in a method for film insertion of a method for manufacturing a photovoltaic module according to embodiments of the disclosure. FIG. 7 is a schematic top view of a structure corresponding to an operation of moving a cell string relative to the film strip in a method for film insertion of a method for manufacturing a photovoltaic module according to embodiments of the disclosure.

Referring to FIGS. 6 and 7, the respective cell string is moved relative to the at least one film strip 102 so that at least part of each film strip 102 exposed outside the film insertion opening 20 is inserted into the corresponding film insertion opening 20. That is, each film strip 102 is fixed and the film insertion opening 20 is moved so that at least part of each film strip 102 exposed outside the corresponding film insertion opening 20 enters the corresponding film insertion opening 20. During moving of the respective cell string, the respective cell string is moved as a whole, and each cell 101 in the respective cell string is moved in a direction of the film strip 102 exposed outside the corresponding film insertion opening 20, so that each film strip 102 exposed outside the film insertion opening 20 enters the film insertion opening 20.

In some embodiments, during moving of the cell string relative to the film strip 102, an end portion of the (n-1)-th cell 101 and an end portion of the n-th cell which are stacked are kept open to keep the film insertion opening 20 open. During moving of the cell string, the film insertion opening 20 can be kept unchanged, that is, the opening between the cells 101 corresponding to the overlapping welding region 10 does not need to be increased, and the film strip 102 can be entered into the film insertion opening 20 by moving the cell string. Therefore, the first end portion 21 of the cell 101 does not need to be further raised, thus avoiding further crack of the cells 101 and improving the phenomenon of cracking of the cell 101.

In some embodiments, at least part of each film strip 102 exposed outside the film insertion opening 20 is inserted into the film insertion opening 20 as follows. The film strip 102 is completely inserted into the film insertion opening 20, i.e., the entire film strip 102 in the width direction is inserted into the film insertion opening 20. Thereafter, after each film insertion opening 20 is closed, the film strip 102 between the cells 101 corresponding to the overlapping welding region 10 is relatively wide, which can provide a good cushioning effect for the overlapping welding region 10. Alternatively, the film strip 102 partially exposed outside the film insertion opening 20 is partially inserted into the film insertion opening 20, i.e., a part of the film strip 102 in the width direction exposed outside the film insertion opening 20 is inserted into the film insertion opening 20, and a first side edge of the film strip 102 is still exposed outside the film insertion opening 20.

After the film insertion is completed, the film insertion openings 20 are closed, so that each film strip 102 is inserted between the two cells 101 corresponding to the overlapping welding region 10. In some embodiments, after moving the cell string relative to the film strip 102, an orthographic projection of the film strip 102 on the cell 101 coincides with the overlapping welding region 10. In some embodiments, the orthographic projection of the film strip 102 on the cell 101 just coincides with the overlapping welding region 10. In other embodiments, the overlapping welding region 10 is located within the orthographic projection of the film strip 102 on the cell 101, i.e., a width of the film strip 102 is greater than a width of the overlapping welding region 10 in the arrangement direction of the cells, so that part of the film strip 102 is also located on a surface of the cell 101 corresponding to the non-overlapping welding region (outside the overlapping welding region 101), thereby further avoiding cracking of the cell 101 during laminating. The reason is that, during the laminating, there may be a deviation between the adjacent cells 101 corresponding to the overlapping welding region 10, so that a width of the adjacent cells 101 being overlapped becomes larger or smaller. If the width of the adjacent cells 101 being overlapped becomes larger, since the film strip 102 is also located on the surface of the cell 101 corresponding to the non-overlapping welding region (i.e., outside the overlapping welding region 10), even if the cells 101 are shifted, a good cushioning effect can be provided for an overlapping region of the adjacent cells 101. In some embodiments, the non-overlapping welding region is a region of the cell 101 other than the overlapping welding region 10.

In some embodiments, the film insertion openings 20 are closed as follows. The originally raised first end portion of each cell 101 is absorbed and fixed by a vacuum adsorption device, and then the first end portion of each cell 101 is lowered until the first end portion of the cell 101 is stacked with the second end portion of the adjacent cell 101, such that each film insertion opening 20 is closed. Since each film strip 102 is positioned within the film insertion opening 20 and each film insertion opening 20 corresponds to one overlapping welding region 10, after the film insertion opening 20 is closed, the film strip 102 is inserted between the two cells 101 corresponding to the overlapping welding region 10.

In some embodiments, the at least one cell string may include only one cell string and each film strip 102 may be partially inserted into one film insertion opening 20 in the cell string.

In some embodiments, providing the at least one cell string includes forming a plurality of cell strings spaced apart from each other along a preset direction (e.g., Z direction shown in the figures). That is, in some embodiments, the at least one cell string may include multiple cell strings. The multiple cell strings are aligned in a preset direction prior to the film insertion. That is, the cell strings are layout in advance. After the film insertion, there is no need to layout the cell strings again. In this way, it is possible to avoid damage to the layout of the cell strings during transportation due to re-layout the cell strings after the film insertion and an increase of the difficulty of subsequent layout.

In some embodiments, there are the multiple cell strings. An end portion of each cell 101 of each cell string of the multiple cell strings and an end portion of an adjacent cell 101 are opened to form a corresponding film insertion opening 20. In other words, for each overlapping welding region 10 of the respective cell string of the multiple cell strings, the film insertion opening 20 between the stacked end portions of the two adjacent cells 101 corresponding to the each overlapping welding region 10 is formed. In some embodiments, each cell string includes N cells. Each two adjacent cells 101 form the film insertion opening 20, and thus each cell string has N-1 film insertion openings 20. For the method of opening an end portion of each cell 101 and an end portion of an adjacent cell 101 of each cell string of the multiple cell strings, reference may be made to the above-described method of opening the first end portion 21 of each cell 101 and the second end portion 22 of an adjacent cell 101 in one cell string.

In some embodiments, providing the at least one film strip 102 includes providing multiple film strips, where multiple film strips 102 are inserted into different film insertion openings 20 of each cell string respectively. Each film strip 102 extends in a preset direction, and each film strip 102 is inserted into a corresponding film insertion opening 20 of each cell string of the multiple cell strings. That is, in embodiments of the present disclosure, each film strip 102 inserted into the corresponding film insertion openings 20 extends along an arrangement direction of the cell strings, such that each film strip 102 is simultaneously inserted into a corresponding film insertion opening 20 of each of the multiple cell strings. In this way, the multiple cell strings can be simultaneously subjected to film insertion in a same film insertion operation. After the film strip 102 is closed, each film strip 102 is inserted into a corresponding overlapping welding region 10 of each of all cell strings, thereby greatly improving the film insertion efficiency.

In some embodiments, the film strips 102 and overlapping welding regions 10 in each cell string are in one-to-one correspondence. That is, each film strip 102 of the multiple film strips 102 is inserted in a different overlapping welding region 10 in each cell string, and each film strip 102 corresponds to one overlapping welding region 10, so that each overlapping welding region 10 in each cell string is inserted with a corresponding film strip 102.

For example, if there are 5 cell strings, and the number of cells 101 in each cell string is 5, four film insertion openings 20 may be formed in each cell string. Therefore, there may be 4 film strips 102, and each of the four film strips 102 may be inserted into a corresponding one film insertion opening 20 of the four film insertion openings 20 in each cell string. In addition, a same film strip 102 (each film strip 102) is simultaneously inserted into one film insertion opening 20 of each cell string of the 5 cell strings, so that each film insertion opening 20 of the multiple cell strings is inserted with the corresponding film strip 102.

In some embodiments, each of the multiple film strips is inserted into a corresponding film insertion opening 20 of each of the multiple cell strings as follows.

Each of the film strips 102 is placed above each of the cell strings, and each of the film strips 102 extends in the preset direction. Each of the film strips 102 is aligned with a corresponding film insertion opening 20 in each of the cell strings. In some embodiments, a film strip roll is cut using a film cutting apparatus to obtain a plurality of film strips 102 of a desired length. Thereafter, the two ends of each film strip 102 are clamped by a clamping device, and the film strip 102 is moved above the multiple cell strings, and each film strip 102 extends in the preset direction.

The two ends of each film strip 102 in the preset direction are stretched in a direction away from each other, and each film strip 102 is lowered to insert each film strip 102 into a corresponding film insertion opening 20. Each of the film strips 102 is tensioned and each film strip of the film strips 102 corresponds to one of the film insertion openings 20 in each cell string of all the cell strings. The film strip 102 is inserted into a corresponding film insertion opening 20, i.e., a same film strip 102 is inserted into a corresponding film insertion opening 20 of each of all the cell strings.

An end portion of each cell 101 in each cell string and an end portion of an adjacent cell 101 are moved in a direction close to each other to close the film insertion opening 20, and each film strip 102 inserted in the film insertion opening 20 is positioned between two cells 101 corresponding to the overlapping welding region 10. In some embodiments, a vacuum adsorption device may be used to lower the first end portion 21 originally raised of the cell 101, so that the first end portion 21 of each cell 101 and the second end portion 22 of the adjacent cell 101 are re-stacked to enable that the film insertion opening 20 is closed.

Figure 8:
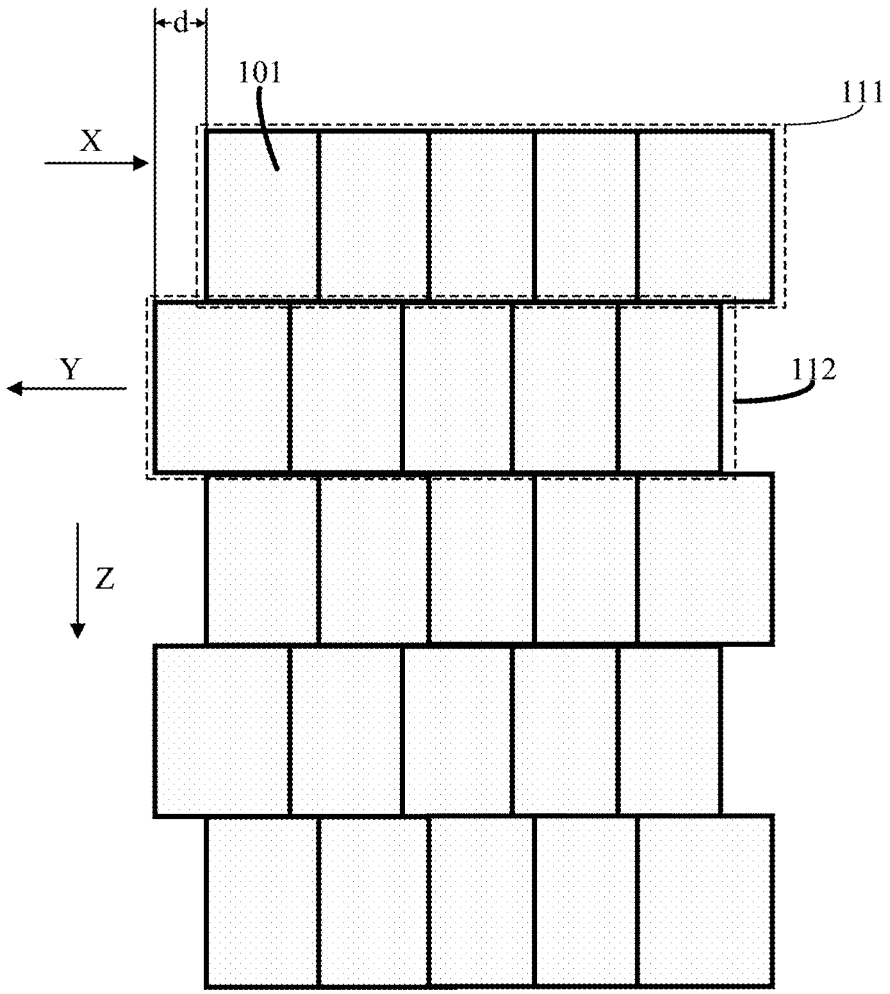
FIG. 8 is a schematic top view of a structure corresponding to an operation of providing a cell string in a method for film insertion of a method for manufacturing a photovoltaic module according to other embodiments of the disclosure.

FIG. 8 is a schematic top view of a structure corresponding to an operation of providing a cell string in a method for film insertion of a method for manufacturing a photovoltaic module according to other embodiments of the disclosure.

Referring to FIG. 8, in some embodiments, the plurality of cell strings may include first sub-cell strings 111 and second sub-cell strings 112 that are alternately arranged in a preset direction Z. In each first sub-cell string 111, a first cell 101 to a N-th cell are arranged in sequence in a first direction X. In each second sub-cell string 112, a first cell 101 to a N-th cell are arranged in sequence in a second direction Y, the first direction X being opposite to the second direction Y. The N cells in each first sub-cell string of first sub-cell strings 111 or each second sub-cell string of second sub-cell strings 112 are all arranged in sequence in a same direction, where a first end portion 21 of a n-th cell is placed on a second end portion 22 of a (n-1)-th cell 101, $1<n\leq N$. An arrangement direction of the first cell 101 to the N-th cell in each first sub-cell string 111 is opposite to an arrangement direction of the first cell 101 to the N-th cell in each second sub-cell string 112. That is, in the first sub-cell string 111, a direction from the first end portion 21 to the second end portion 22 of each cell 101 is the first direction X. In the second sub-cell string 112, a direction from the first end portion to the second end portion 22 of each cell 101 is the second direction Y.

Each film strip 102 is simultaneously inserted into a corresponding film insertion opening 20 of each of the multiple strings as follows.

Before forming the film insertion opening 20, each second sub-cell string 112 is offset in the second direction Y with respect to a corresponding first sub-cell string 111.

In some embodiments, each second sub-cell string 112 is offset in the second direction Y relative to the corresponding first sub-cell string 111 as follows.

The first sub-cell strings 111 and the second sub-cell strings 112 alternately arranged in the preset direction Z are formed. The first sub-cell strings 111 and the second sub-cell strings 112 are aligned in the preset direction Z. In some embodiments, each of the first sub-cell strings 111 and each of the second sub-cell strings 112 may be vacuum-adsorbed using a stacking machine. For example, a vacuum suction cup on a surface of each cell 101 may be adsorbed, thereby adsorbing and fixing the entire cell string. After adsorption and fixation, each first sub-cell string 111 and each second sub-cell string 112 are moved so that the first sub-cell string 111 and the second sub-cell string 112 are alternately arranged in the preset direction Z, and the first sub-cell string 111 and the second sub-cell string 112 are aligned in the preset direction Z.

In some embodiments, each second sub-cell string 112 may be moved in the second direction Y with respect to the corresponding first sub-cell string 111 such that each second sub-cell string 112 is offset in the second direction Y by a first offset amount d with respect to the corresponding first sub-cell string 111. That is, after each second sub-cell string 112 is adsorbed and fixed by the stacking machine, each second sub-cell string 112 can be moved with respect to a corresponding first sub-cell string 111 so that each second sub-cell string 112 is offset with respect to the corresponding first sub-cell string 111 by the first offset amount d.

In some embodiments, the first sub-cell strings 111 may also be moved in the first direction X with respect to each second sub-cell string 112 such that each second sub-cell string 112 is offset in the second direction Y by the first offset amount d with respect to a corresponding first sub-cell string 111. In some embodiments, after each first sub-cell string 111 is adsorbed and fixed by the stacking machine, each first sub-cell string 111 may be moved with respect to a corresponding second sub-cell string 112 such that each first sub-cell string 111 is offset with respect to the corresponding second sub-cell string 112 by the first offset amount d.

In some embodiments, each second sub-cell string 112 may also be moved in the second direction Y with respect to a corresponding first sub-cell string 111 by a first sub-offset amount, and each first sub-cell string 111 may be moved in the first direction X with respect to a corresponding second sub-cell string 112 by a second sub-offset amount, where the sum of the first sub-offset amount and the second sub-offset amount is equal to the first offset amount d. That is, after each second sub-cell string 112 and each first sub-cell string 111 are adsorbed and fixed by the stacking machine, the first sub-cell strings 111 and the second sub-cell strings 112 are simultaneously moved in opposite directions, such that an offset amount between the first sub-cell string 111 and the second sub-cell string 112 is equal to the first offset amount d.

In some embodiments, each first sub-cell string 111 has the same number of film insertion openings 20 as the number of film insertion openings 20 in each second sub-cell string 112, and each film insertion opening 20 in the first sub-cell string 111 may correspond to one film insertion opening 20 in the second sub-cell string 112. The same film strip 102 is inserted into a corresponding film insertion opening 20 in each of the first sub-cell strings 111 and a corresponding film insertion opening 20 in each of the second sub-cell strings 112. However, since each second sub-cell string 112 is offset in the second direction Y with respect to the corresponding first sub-cell string 111, each film insertion opening 20 in the first sub-cell string 111 and a corresponding film insertion opening 20 in the second sub-cell string 112 are not aligned in the preset direction Z.

In order to ensure the same film strip 102 to extend along the preset direction Z and to be inserted into a corresponding film insertion opening 20 of each first sub-cell string 111 and a corresponding film insertion opening 20 of each second sub-cell string 112, an offset amount of each second sub-cell string 112 from each first sub-cell string 111 is set not to exceed a width of the cell 101 in each first sub-cell string 111 in the first direction X, and the first offset amount d of each second sub-cell string 112 from a corresponding first sub-cell string 111 is controlled to be in a range of 5 mm to 50 mm, for example, 5 mm to 8 mm, 8 mm to 10 mm, 10 mm to 15 mm, 15 mm to 20 mm, 20 mm to 25 mm, 25 mm to 30 mm, 30 mm to 35 mm, 35 mm to 40 mm, 40 mm to 45 mm, or 45 mm to 50 mm. By setting the first offset amount d to be in the above range, it is ensured that the same film strip 102 can extend in the preset direction Z and be inserted into the corresponding film insertion opening 20 of each first sub-cell string 111 and the corresponding film insertion opening 20 of each second sub-cell string 112.

Figure 9:
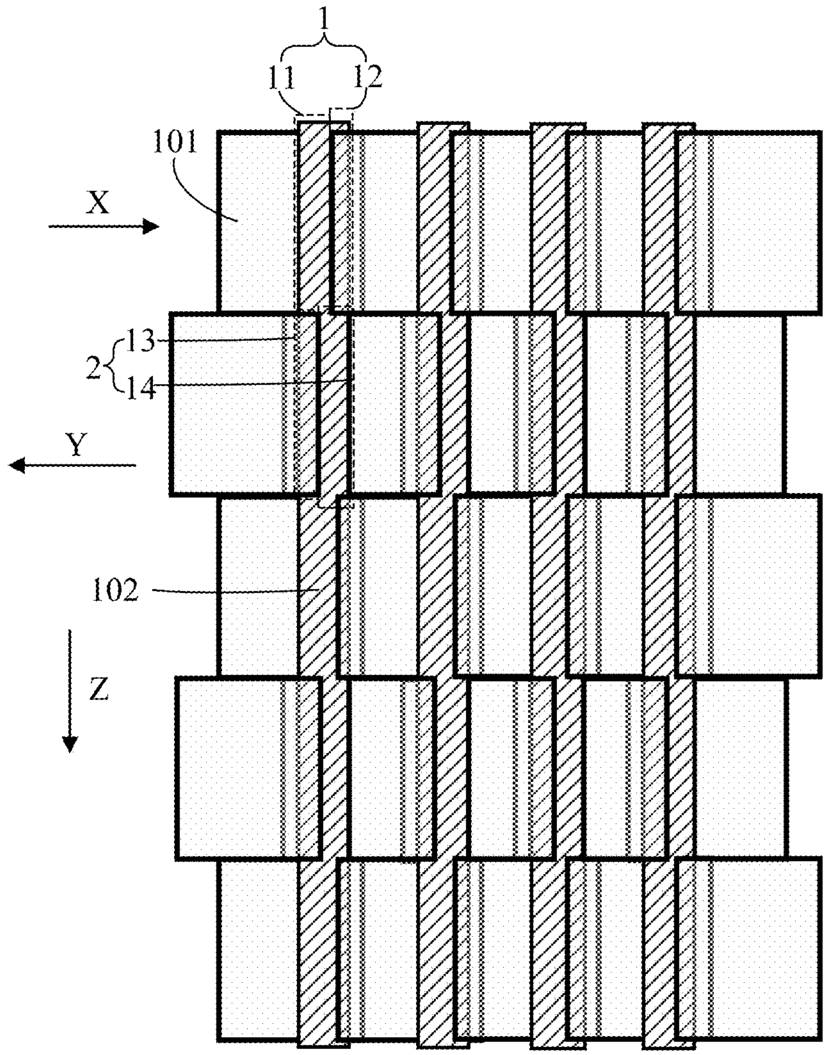
FIG. 9 is a schematic top view of a structure corresponding to an operation of inserting a part of a film strip into a film insertion opening in a method for film insertion of a method for manufacturing a photovoltaic module according to other embodiments of the disclosure.

FIG. 9 is a schematic top view of a structure corresponding to an operation of inserting a part of a film strip into a film insertion opening in a method for film insertion of a method for manufacturing a photovoltaic module according to other embodiments of the disclosure.

Referring to FIG. 9, a plurality of film strips are provided and each film strip 102 of the plurality of film strips is inserted into corresponding film insertion openings 20.

Since the arrangement direction of the first cell 101 to the N-th cells in the first sub-cell string 111 is opposite to the arrangement direction of the first cell 101 to the N-th cells in the second sub-cell string 112, the film insertion openings 20 formed in each first sub-cell string 111 are opened in the first direction X, and the film insertion openings 20 formed in each second sub-cell string 112 are opened in the second direction Y. That is, the film insertion openings 20 of each first sub-cell string 111 and each second sub-cell string 112 are not opened from a same side of the film strip 102. In this way, if the same film strip 102 is inserted into the film insertion opening 20 of each first sub-cell string 111 and the film insertion opening 20 of each second sub-cell string 112 at the same time, a part of the film strip 102 exposed outside the film insertion openings 20 in the first sub-cell string 111 and a part of the film strip 102 exposed outside the film insertion openings 20 in the second sub-cell string 112 are not on the same side of the film strip 102. Therefore, in the subsequent operation of moving the first sub-cell strings 111 and the second sub-cell strings 112 in a direction close to each other to enable the first sub-cell strings 111 and the second sub-cell strings 112 to be aligned, since a moving direction of each of the first sub-cell strings 111 is inconsistent with a moving direction of a corresponding one of the second sub-cell strings 112, the film strip 102 exposed outside the film insertion openings 20 can be inserted into the film insertion opening 20 of each of the first sub-cell strings 111 and the film insertion opening 20 of each of the second sub-cell strings 112.

Specifically, in some embodiments, each of the plurality of film strips includes first portions 1 and second portions 2, where each first portion 1 corresponds to a respective first sub-cell string 111 and each second portion 2 corresponds to a respective second sub-cell string 112. Each first portion 1 includes a first segment 11 and a second segment 12 arranged in the first direction X, and each second portion 2 includes a third segment 13 and a fourth segment 14 arranged in the first direction X. Each second segment 12 is inserted into one film insertion opening 20 of the corresponding first sub-cell string 111, and each first segment 11 is exposed on a cell 101 of the corresponding first sub-cell string 111 outside the one film insertion opening 20. Each third segment 13 is inserted into one film insertion opening 20 of a corresponding second sub-cell string 112, and each fourth segment 14 is exposed on a cell 101 of the corresponding second sub-cell string 112 outside the one film insertion opening 20.

The first portions 1 and the second portions 2 of each film strip 102 are alternately arranged in the preset direction Z. The first segment 11 of the first portion 1 and the third segment 13 of the second portion 2 are located on a same side of the film strip 102 along the second direction Y, and the second segment of the first portion 1 and the fourth segment 14 of the second portion 2 are located on a same side of the film strip 102 along the first direction X. Since the arrangement direction of the cells 101 of each first sub-cell string 111 is opposite to the arrangement direction of the cells of each second sub-cell string 112, the film insertion openings 20 in each first sub-cell string 111 are opened in the first direction X, and the film insertion openings 20 in each second sub-cell string 112 are opened in the second direction Y, parts of the first portion 1 and the second portion 2 on different sides of the film strip 102 are inserted into corresponding film insertion openings 20, respectively.

Specifically, the second segment 12 of each first portion 1 is inserted into the corresponding film insertion opening 20, and the first segment of each first portion 1 is exposed on the cell 101 outside the corresponding film insertion opening 20. The third segment 13 of each second portion 2 is inserted into the corresponding film insertion opening 20, and the fourth segment 14 of each second portion 2 is exposed on the cell 101 outside the corresponding film insertion opening 20.

Figure 10:
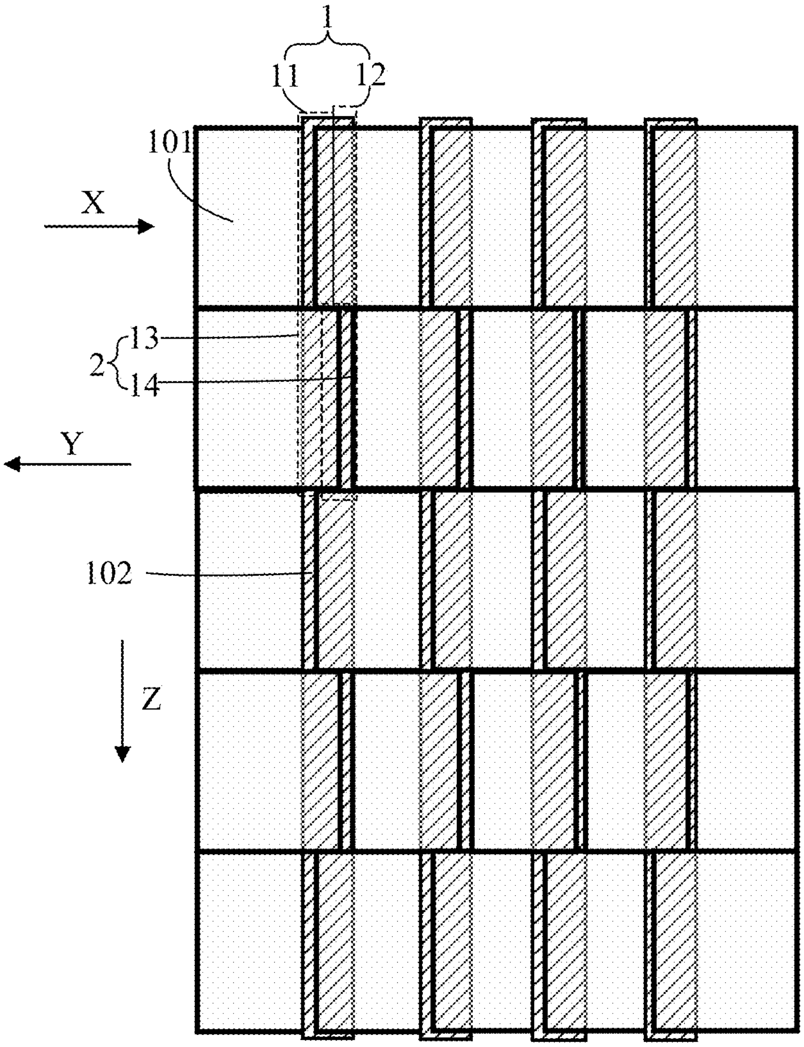
FIG. 10 is a schematic top view of a structure corresponding to an operation of moving a cell string relative to the film strip in a method for film insertion of a method for manufacturing a photovoltaic module according to other embodiments of the disclosure.
Figure 11:
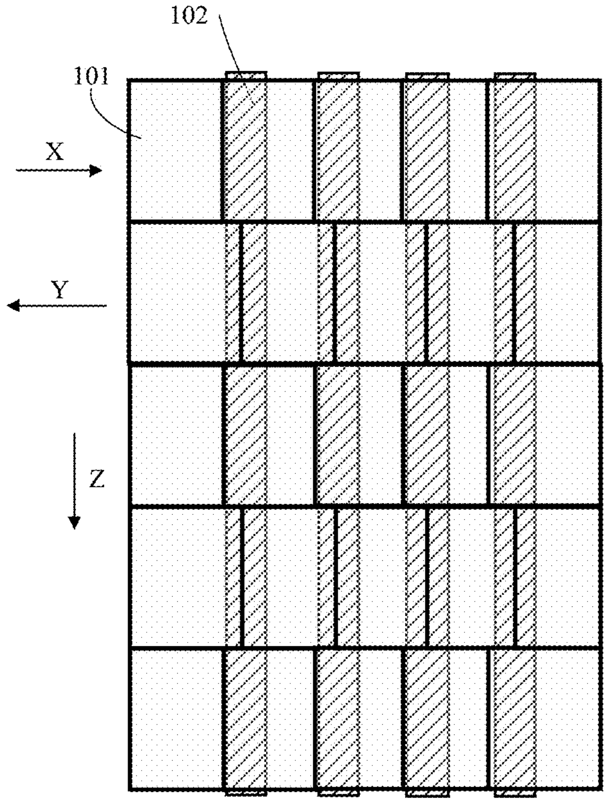
FIG. 11 is a schematic top view of a structure corresponding to another operation of moving a cell string relative to the film strip in a method for film insertion of a method for manufacturing a photovoltaic module according to other embodiments of the disclosure.

FIG. 10 is a schematic top view of a structure corresponding to an operation of moving a cell string relative to the film strip 102 in a method for film insertion of a method for manufacturing a photovoltaic module according to other embodiments of the disclosure. FIG. 11 is a schematic top view of a structure corresponding to another operation of moving a cell string relative to the film strip 102 in a method for film insertion of a method for manufacturing a photovoltaic module according to other embodiments of the disclosure.

Referring to FIGS. 10 and 11, each first sub-cell string 111 is moved in the second direction Y with respect to each film strip 102 so that at least a part of the first segment 11 of each film strip 102 is inserted into the corresponding film insertion opening 20. The film insertion openings 20 of each first sub-cell string 111 are opened in the first direction X. Therefore, at least the part of the first segment 11 of each film strip 102 not inserted in the film insertion opening 20 can be inserted into the corresponding film insertion opening 20 by moving each first sub-cell string 111 in the second direction Y. Each second sub-cell string 112 is moved in the first direction X with respect to each film strip 102 so that at least a part of the fourth segment 14 of each film strip 102 is inserted into the corresponding film insertion opening 20, and the film insertion openings 20 of each second sub-cell string 112 are opened in the second direction Y. Therefore, at least the part of the fourth segment 14 of each film strip 102 not inserted in the film insertion opening 20 can be inserted into the corresponding film insertion opening 20 by moving the second sub-cell string 112 in the first direction X. After each of the first sub-cell strings 111 and each of the second sub-cell strings 112 are moved, the first sub-cell strings 111 and the second sub-cell strings 112 can be aligned in the preset direction Z to complete the layout of the plurality of cell strings.

In some embodiments, the at least the part of each first segment 11 is inserted into the corresponding film insertion opening 20 as follows. With reference to FIG. 10, a part of each first segment 11 enters the corresponding film insertion opening 20 and an edge of the film strip 102 corresponding to each first segment 11 is still exposed outside the corresponding film insertion opening 20. Referring to FIG. 11, each first segment 11 is completely inserted into the corresponding film insertion opening 20.

In some embodiments, at least the part of each fourth segment 14 is inserted into the corresponding film insertion opening 20 as follows. With reference to FIG. 10, a part of each fourth segment 14 enters the corresponding film insertion opening 20 and an edge of the film strip 102 corresponding to each fourth segment 14 still exposed outside the corresponding film insertion opening 20. Referring to FIG. 11, each fourth segment 14 is completely inserted into the corresponding film insertion opening 20.

As can be seen, in the embodiments of the present disclosure, by enabling the first sub-cell string 111 and the second sub-cell string 112 in a staggered arrangement, and inserting part of the same film strip 102 into a film insertion opening 20 of each first sub-cell string 111 and a film insertion opening 20 of each second sub-cell string 112, film insertion for each cell string is realized under the condition that the film insertion opening 20 is relatively small, and the film insertion efficiency is improved. After the subsequent film insertion is completed, the cells 101 are moved so that the first sub-cell strings 111 and the second sub-cell strings 112 are arranged in alignment, which not only completes the layout of the cell strings, but also makes the remaining part of each film strip 102 exposed outside the film insertion opening 20 enter the film insertion opening 20, so that more parts of each film strip 102 enters the film insertion opening 20, and the width of the part of the film strip 102 inserted in the overlapping welding region 10 is increased, which improves the buffering effect of the film strip 102 on the overlapping welding region 10 and greatly saves efficiency.

In some embodiments, each first sub-cell string 111 is moved in the second direction Y with respect to each film strip 102, and each second sub-cell string 112 is moved in the first direction X with respect to each film strip 102 as follows. Each film strip 102 is fixed, each cell 101 of each first sub-cell string 111 is moved by a first displacement amount in the second direction Y, and each cell 101 of each second sub-cell string 112 is moved by a second displacement amount in the first direction X. That is, during moving of each first sub-cell string 111 and each second sub-cell string 112, the cells 101 in each first sub-cell string 111 have a same displacement amount, and the cells 101 in each second sub-cell string 112 have a same displacement amount, so that the relative positional relationship between adjacent cells 101 can be kept unchanged, and the success rate of film insertion can be improved.

In some embodiments, each second sub-cell string 112 is offset by a first offset amount d relative to a corresponding first sub-cell string 111 in the second direction Y, which is equivalent to that each first sub-cell string 111 is moved by a first displacement amount relative to a corresponding film strip 102 in the second direction Y, and each second sub-cell string 112 is moved by a second displacement amount relative to a corresponding film strip 102 in the first direction X, and the sum of the first displacement and the second displacement being equal to the first offset amount d. After the film insertion, each first sub-cell string 111 and each second sub-cell string 112 are moved in a direction close to each other, and the sum of a displacement amount of each first sub-cell string 111 and a displacement amount of a corresponding second sub-cell string 112 is equal to an offset amount between the corresponding second sub-cell string 112 and each first sub-cell string 111 before the film insertion. Thereafter, after each first sub-cell string 111 and each second sub-cell string 112 are moved in the direction close to each other, the offset amount between the corresponding second sub-cell string 112 and each first sub-cell string 111 before the film insertion can be eliminated, so that each second sub-cell string 112 and each first sub-cell string 111 are aligned in the preset direction Z, thereby regularizing the cell strings.

In some embodiments, the first displacement amount is equal to the second displacement amount. In some embodiments, during moving of each of the first sub-cell strings 111 and each of the second sub-cell strings 112 in the direction close to each other, each of the first sub-cell strings 111 is moved in the second direction Y by the same displacement amount as by which each of the second sub-cell strings 112 is moved in the first direction X, which facilitates synchronous movement of each of the first sub-cell strings 111 and each of the second sub-cell strings 112.

In some embodiments, the first displacement amount may not be equal to the second displacement amount. For example, the first displacement amount may be greater than the second displacement amount, or the first displacement amount may be less than the second displacement amount. There is no restriction on the specific relationship between the first displacement amount and the second displacement amount as long as the sum of the first displacement amount and the second displacement amount is equal to the first offset amount d.

Figure 12:
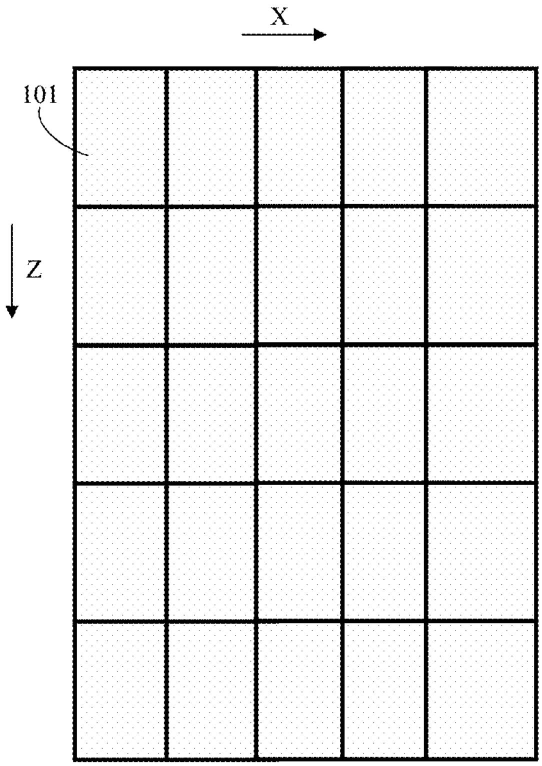
FIG. 12 is a schematic top view of a structure corresponding to an operation of providing a cell string in a method for film insertion of a method for manufacturing a photovoltaic module according to other embodiments of the disclosure.
Figure 13:
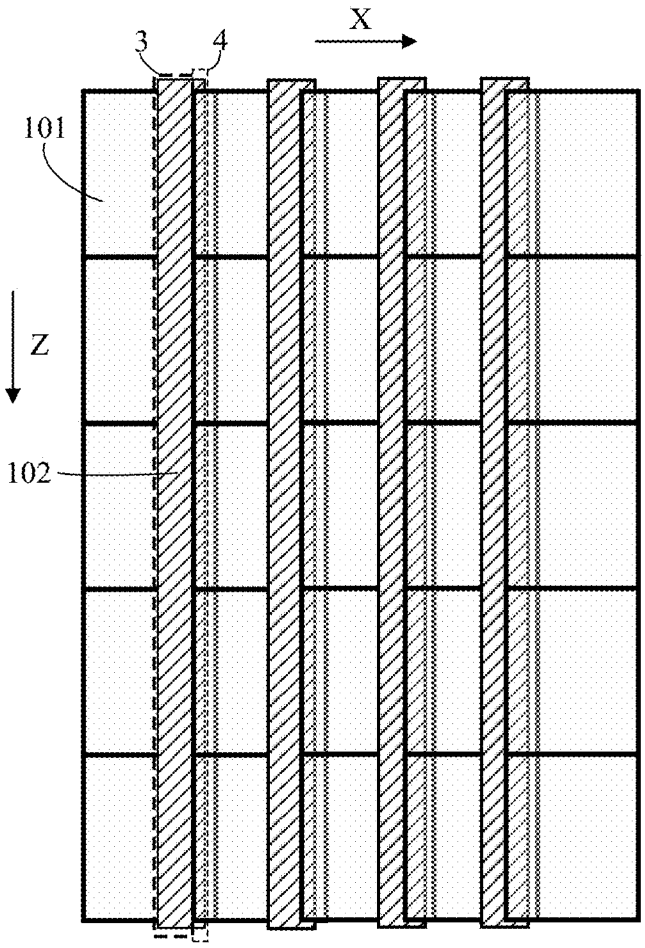
FIG. 13 is a schematic top view of a structure corresponding to an operation of inserting a part of a film strip into a film insertion opening in a method for film insertion of a method for manufacturing a photovoltaic module according to other embodiments of the disclosure.

FIG. 12 is a schematic top view of a structure corresponding to an operation of providing a cell string in a method for film insertion of a method for manufacturing a photovoltaic module according to other embodiments of the disclosure. FIG. 13 is a schematic top view of a structure corresponding to an operation of inserting a part of a film strip 102 into a film insertion opening 20 in a method for film insertion of a method for manufacturing a photovoltaic module according to other embodiments of the disclosure.

Referring to FIG. 12, in some embodiments, the first cell 101 to the N-th cell of each cell string of two adjacent cell strings in the plurality of cell strings may all be sequentially arranged in the first direction X, and the two adjacent cell strings may be aligned in the preset direction Z. That is, in each of the two adjacent cell strings, the cells 101 are arranged in the same direction, so that the film insertion openings 20 in each cell string are opened in the first direction X, that is, the film insertion openings 20 of the adjacent cell strings are opened on a same side of the file strip 102.

Alternatively, in some embodiments, the first cell 101 to the N-th cell of each cell string of two adjacent cell strings in the plurality of cell strings may all be sequentially arranged in the second direction Y, and the two adjacent cell strings may be aligned in the preset direction Z. That is, in each of the two adjacent cell strings, the cells 101 are arranged in the same direction, so that the film insertion openings 20 in each cell string are opened in the second direction Y, that is, the film insertion openings 20 of the adjacent cell strings are opened on a same side of the file strip 102.

Referring to FIG. 13, each of the multiple film strips is inserted into a corresponding film insertion opening 20 of each of the multiple cell strings as follows.

Multiple film strips are provided, and each of the multiple film strips includes a third portion 3 and a fourth portion 4 arranged in a first direction X. Each of the third portion 3 and the fourth portion 4 extends in the preset direction Z. The third portion 3 of the same film strip 102 is across the plurality of cell strings, and the fourth portion 4 of the same film strip 102 is across the plurality of cell strings.

The fourth portion 4 of each film strip 102 is inserted into a corresponding film insertion opening 20 of each of the plurality of cell strings, and the third portion 3 is exposed on the cell 101 outside the corresponding film insertion opening 20. In some embodiments, the plurality of cell strings are aligned in the preset direction Z. Film insertion openings 20 in each cell string and film insertion openings 20 in an adjacent cell string are aligned one by one in the preset direction Z. Since the film insertion openings 20 of adjacent cell strings are opened on the same side, the fourth portion 4 located on one side of the same film strip 102 is inserted into one film insertion opening 20 of each of the plurality of cell strings at the same time, and the third portion 3 located on the other side of the same film strip 102 is exposed on the cell 101 outside the film insertion opening 20.

Figure 14:
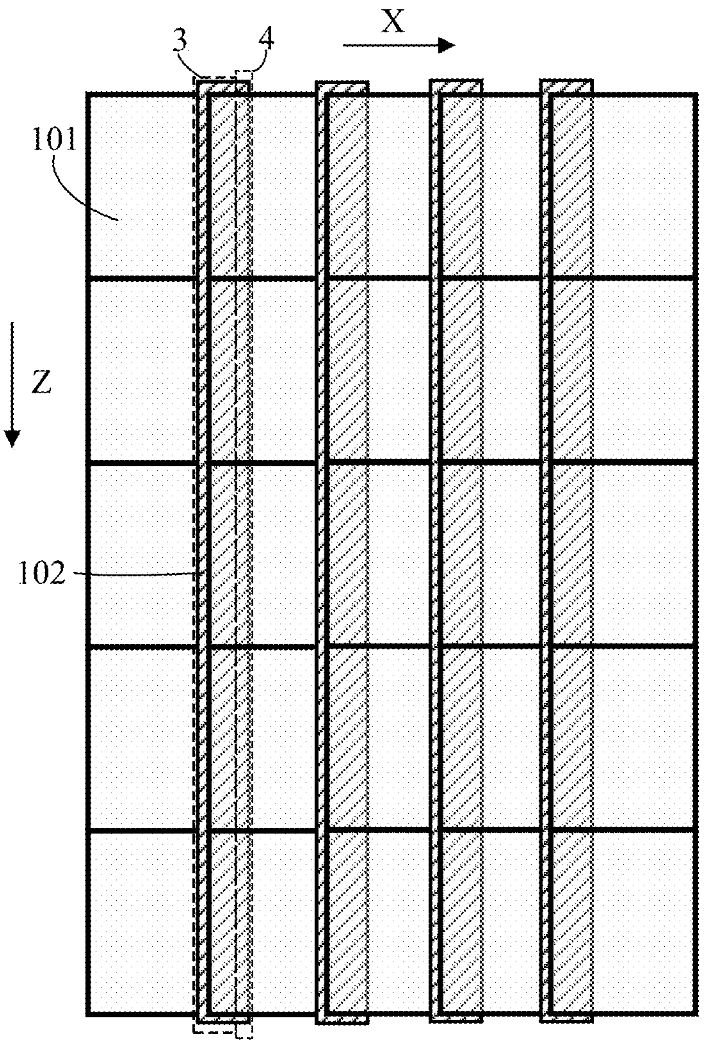
FIG. 14 is a schematic top view of a structure corresponding to an operation of moving a cell string relative to the film strip in a method for film insertion of a method for manufacturing a photovoltaic module according to other embodiments of the disclosure.
Figure 15:
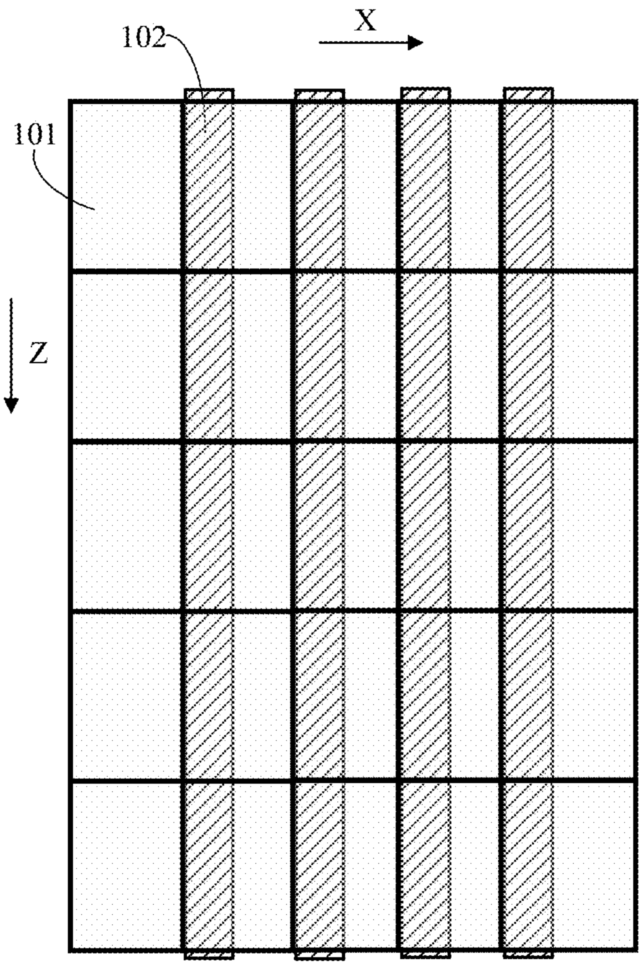
FIG. 15 is a schematic top view of a structure corresponding to an operation of moving a cell string relative to the film strip in a method for film insertion of a method for manufacturing a photovoltaic module according to other embodiments of the disclosure.

FIG. 14 is a schematic top view of a structure corresponding to an operation of moving a cell string relative to the film strip 102 in a method for film insertion of a method for manufacturing a photovoltaic module according to other embodiments of the disclosure. FIG. 15 is a schematic top view of a structure corresponding to an operation of moving a cell string relative to the film strip 102 in a method for film insertion of a method for manufacturing a photovoltaic module according to other embodiments of the disclosure.

Referring to FIGS. 14 and 15, each cell string is moved in the second direction Y with respect to each film strip 102 so that at least a part of the third portion 3 of the film strip 102 is inserted into the film insertion opening 20. That is, each cell string is moved in the second direction Y without moving the film strip 102. Since the film insertion openings 20 in each cell string are opened in the first direction X, the cell strings are moved in the second direction Y so that the film insertion opening 20 are moved in the second direction Y with respect to each film strip 102, and at least the part of the third portion 3 exposed outside the film insertion opening 20 can enter the film insertion opening 20.

In some embodiments, at least the part of the third portion 3 enters the film insertion opening 20 as follows. Referring to FIG. 14, the part of the third portion 3 enters the film insertion opening 20, such that an edge of the film strip 102 corresponding to the third portion 3 remains exposed outside the film insertion opening 20. Alternatively, referring to FIG. 15, all the third portion 3 enters the film insertion opening 20.

In the method for film insertion of the photovoltaic module provided in the above-described embodiments, the film strip 102 is partially inserted into the film insertion opening 20, so that the film insertion opening 20 can be smaller than a film insertion opening into which a film strip is completely inserted. Thus, in an operation of opening the end portions of the adjacent cells 101, an opening degree of each of the end portions of the adjacent cells 101 is relatively small, which is beneficial to reducing cracking of the cells 101 in the process of raising the cells 101. After film insertion, the cell string is moved relative to the film strip 102, so that an exposed film strip 102 can be inserted into the overlapping welding region 10, a width of the film strip 102 inserted into the overlapping welding region 10 is increased, and the buffering capacity of the film strip 102 to the overlapping welding regions 10 is improved. In addition, by adopting a manner of moving the cell string, the remaining part of each film strip 102 can be inserted into the film insertion opening 20 without increasing the opening between the cells 101 in the overlapping welding regions 10 again, such that cracking of the cells may be avoided.

Figure 16:
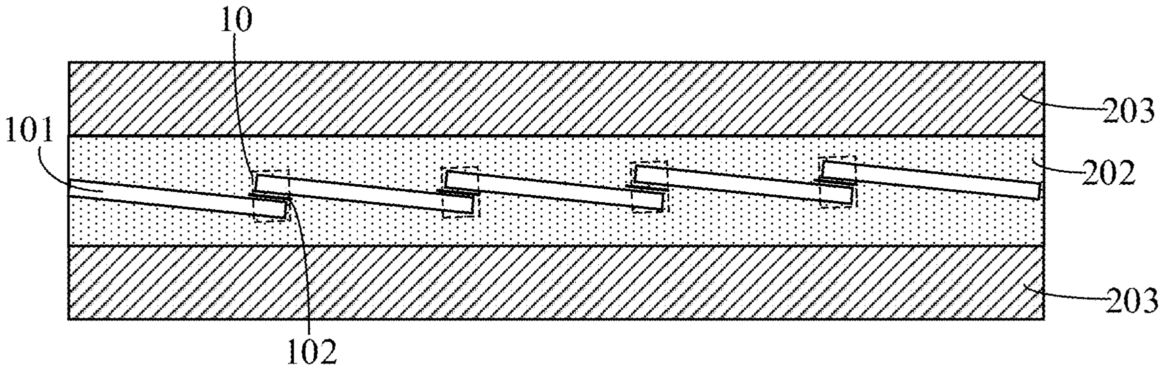
FIG. 16 is a cross-sectional structural diagram of a photovoltaic module according to embodiments of the disclosure.

Accordingly, embodiments of the present disclosure further provide a photovoltaic module. Referring to FIG. 16, the photovoltaic module includes multiple cell strings. Each cell string includes N cells arranged in sequence along a same direction, where an end portion of each cell 101 of the N cells is stacked with an end portion of an adjacent cell 101, such that each two adjacent cells 101 form a corresponding overlapping welding region 10, N being greater than 1. The photovoltaic module further includes the plurality of film strips each formed between each two adjacent cells 101 corresponding to different overlapping welding regions 10 of each cell string in a method for film insertion of the photovoltaic module provided in the above-described embodiments. Each film strip 102 of the plurality of film strips corresponds to one overlapping welding region 10 of each cell string. The photovoltaic module further includes a plurality of encapsulation layers 202, where each encapsulation layer 202 is configured to cover a surface of each cell string. The photovoltaic module further includes a plurality of cover plate 203, where each cover plate 203 is configured to cover a surface of a corresponding encapsulation layer away from the plurality of cell strings.

In some embodiments, the photovoltaic module may include the plurality of cell strings arranged along the preset direction Z, each of the plurality of cell strings including N cells arranged in sequence along a same direction. Each cell 101 of the N cells 101 has an overlapping welding region 10, and an end portion of each cell 101 is stacked with an end portion of an adjacent cell 101 to form an overlapping welding region 10, N being greater than 1. Each film strip 102 of the plurality of film strips extends in the preset direction Z, and a same film strip 102 is simultaneously inserted between the cells 101 corresponding to one overlapping welding region 10 of each of the plurality of cell strings. Each film strip 102 of the plurality of film strips corresponds to one overlapping welding region 10 in each cell string.

In some embodiments, the plurality of cell strings may include first sub-cell strings 111 and second sub-cell strings 112 that are alternately arranged along the preset direction Z. In each first sub-cell string 111, a first cell 101 to a N-th cell are arranged in sequence in a first direction X. In each second sub-cell string 112, a first cell 101 to a N-th cell are arranged in sequence in a second direction Y, the first direction X being opposite to the second direction Y. A same film strip 102 (each film strip 102) is inserted into a corresponding film insertion opening 20 of each first sub-cell string 111 and a corresponding film insertion opening 20 of each second sub-cell string 112.

In some embodiments, the first cell 101 to the N-th cell of each cell string of two adjacent cell strings in the plurality of cell strings may all be sequentially arranged in the first direction X, i.e., an arrangement direction of the first cell 101 to the N-th cell in each cell string is the same as an arrangement direction of the first cell 101 to the N-th cell in an adjacent cell string. A same film strip 102 (each film strip 102) is inserted into a corresponding film insertion opening 20 of each cell string.

Specifically, in some embodiments, the plurality of cell strings may be electrically connected by conductive strips. In some embodiments, the conductive strip may be a welding strip for connecting two adjacent cells 101 in series. The welding strip may be located on a surface of each cell 101 and configured to electrically connect the two adjacent cells 101. In some embodiments, the welding strip may be formed prior to forming the plurality of film strips.

The encapsulation layers 202 cover a front surface and a back surface of the substrate of each cell 101. Specifically, the encapsulation layer 202 may be an organic encapsulation film such as an ethylene-vinyl acetate copolymer (EVA) adhesive film, a polyethylene octene co-elastomer (POE) adhesive film, a polyethylene terephthalate (PET) adhesive film, or a polyvinyl butyral (PVB) adhesive film. In some embodiments, the cover plate 203 may be a glass cover plate a plastic cover plate or the like having a light transmitting function. Specifically, a surface of the cover plate 203 facing the encapsulation layer 202 may be a concave-convex surface, thereby increasing the utilization rate of incident light.

Correspondingly, embodiments of the disclosure further provide a method for manufacturing the photovoltaic module, which can be used for manufacturing the photovoltaic module provided in embodiments of the disclosure. The method includes the following.

Cell strings are prepared. In some embodiments, the cell strings can be made by a series welder. The cells 101 are sequentially stacked and arranged in a string, and a welding strip is laid on a surface of each of the cells 101, and the cells 101 are welded in the string through the welding strip. The cell strings formed are arranged in sequence along the preset direction Z by a typesetting machine.

The plurality of film strips are formed, where each film strip is formed between each two adjacent cells 101 corresponding to different overlapping welding regions 10 of each cell string by using the method provided in the above-described embodiments. Each film strip 102 of the plurality of film strips corresponds to one overlapping region 10 of each cell string.

Thereafter, the plurality of encapsulation layers and the plurality of cover plates are manufactured. In some embodiments, the plurality of encapsulation layers include an upper adhesive film and a lower adhesive film, and the plurality of cover plates include an upper cover plate and a lower cover plate.

In some embodiments, a lower adhesive film and an upper adhesive film of a desired size can be obtained by cutting by a film cutter, and the lower adhesive film can be laid onto the lower cover plate.

The plurality of cell strings after typesetting are laid on the lower adhesive film.

Then, the upper adhesive film is laid on the surface of each of the plurality of cell strings, and the upper cover plate is laid on the upper adhesive film.

Finally, the upper adhesive film, the upper cover plate, the cell strings, the lower adhesive film, and the lower cover plate are laminated. During laminating, the lower cover plate is melted with the upper cover plate and the upper adhesive film through melting of the lower adhesive film and the upper adhesive film to form the photovoltaic module.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The foregoing embodiments of the disclosure is disclosed as preferred embodiments, but the foregoing embodiments is not used to limit the claims. Any person skilled in the art can make some possible changes and modifications without departing from the concept of the disclosure. The scope of protection shall be subject to the scope defined by the claims of the disclosure.

Those skilled in the art should appreciate that the embodiments are specific embodiments for implementing the disclosure. In practice, however, various changes may be made in the forms and details of the specific embodiments without departing from the spirit and scope of the disclosure. Any person skilled in the art may make their own changes and modifications without departing from the scope of the disclosure, so the protection scope of the present disclosure shall be subject to the scope defined by the claims.

What is claimed is:

1. A method for manufacturing a photovoltaic module, comprising:

providing at least one cell string, wherein a respective cell string of the at least one cell string includes N cells arranged in sequence along a direction, and an end portion of a respective cell of the N cells overlaps with an end portion of an adjacent cell to form a corresponding overlapping welding region, N being greater than 1;

forming a corresponding film insertion opening between the end portion of the respective cell and the end portion of the adjacent cell that form the corresponding overlapping welding region;

providing at least one film strip, a respective film strip of the at least one film strip having a first end and a second end and extending from the first end to the second end along a preset direction;

stretching the first end and the second end of the respective film strip in directions away from each other before inserting a part of the respective film strip into the corresponding film insertion opening, with a remaining part of the respective film strip exposed outside the corresponding film insertion opening; and closing the corresponding film insertion opening.

2. The method of claim 1, wherein providing the at least one cell string comprises:

providing a plurality of cell strings sequentially arranged along the preset direction, the plurality of cell strings including the respective cell string;

and wherein providing the at least one film strip comprises:

providing a plurality of film strips, wherein each film strip extends along the preset direction;

the method further comprising:

forming a plurality of film insertion openings, each film insertion opening of the plurality of film insertion openings being formed between overlapping end portions of two corresponding adjacent cells of the respective cell string of the plurality of cell strings; and inserting the plurality of film strips into the plurality of film insertion openings.

3. The method of claim 2, wherein the method further comprises:

after inserting the plurality of film strips into the plurality of film insertion openings respectively, moving the plurality of cell strings relative to the plurality of film strips, such that the remaining part of the respective film strip is at least partially inserted into the corresponding film insertion opening.

4. The method of claim 3, wherein the plurality of cell strings comprise first sub-cell strings and second sub-cell strings that are alternately arranged along the preset direction, wherein a first cell to a N-th cell in each of the first sub-cell strings are sequentially arranged along a first direction, and a first cell to a N-th cell in each of the second sub-cell strings are sequentially arranged along a second direction opposite to the first direction;

wherein inserting the plurality of film strips into the plurality of film insertion openings respectively comprises:

prior to forming the plurality of film insertion openings, offsetting the second sub-cell strings in the second direction relative to the first sub-cell strings;

providing the plurality of film strips, wherein the plurality of film strips comprise first portions with respect to the first sub-cell strings and second portions with respect to the second sub-cell strings, wherein each first portion of the first portions includes a first segment and a second segment that are arranged along the first direction, and each second portion of the second portions includes a third segment and a fourth segment that are arranged along the first direction; and inserting the second segment into a respective film insertion opening of a corresponding first sub-cell string, with the first segment exposed outside the respective film insertion opening of the corresponding first sub-cell string, and inserting the third segment into a respective film insertion opening of a corresponding second sub-cell string, with the fourth segment exposed outside the respective film insertion opening of the corresponding second sub-cell string.

5. The method of claim 4, wherein moving the plurality of cell strings relative to the plurality of film strips comprises:

moving the first sub-cell strings relative to the plurality of film strips in the second direction such that at least part of the first segment is inserted into the respective film insertion opening of the corresponding first sub-cell string, and moving the second sub-cell strings relative to the plurality of film strips in the first direction such that at least part of the fourth segment is inserted into the respective film insertion opening of the corresponding second sub-cell string, wherein the first sub-cell strings and the second sub-cell strings are aligned in the preset direction.

6. The method of claim 5, wherein the second sub-cell strings are offset relative to the first sub-cell strings in the second direction by a first offset amount, the first sub-cell strings are offset relative to the plurality of film strips in the second direction by a first displacement amount, the second sub-cell strings are offset relative to the plurality of film strips in the first direction by a second displacement amount, and a sum of the first displacement amount and the second displacement amount is equal to the first offset amount.

7. The method of claim 6, wherein the first displacement amount is equal to the second displacement amount.

8. The method of claim 6, wherein moving the first sub-cell strings relative to the plurality of film strips in the second direction and moving the second sub-cell strings relative to the plurality of film strips in the first direction comprise:

fixing the plurality of film strips; and moving the first sub-cell strings in the second direction by the first displacement amount, and moving the second sub-cell strings in the first direction by the second displacement amount.

9. The method of claim 6, wherein offsetting the second sub-cell strings in the second direction relative to the first sub-cell strings comprises:

forming the first sub-cell strings and the second sub-cell strings that are alternately arranged along the preset direction, wherein the first sub-cell strings and the second sub-cell strings are aligned in the preset direction; and moving the second sub-cell strings relative to the first sub-cell strings in the second direction such that the second sub-cell strings are offset by the first offset amount relative to the first sub-cell strings in the second direction.

10. The method of claim 6, wherein offsetting the second sub-cell strings in the second direction relative to the first sub-cell strings comprises:

forming the first sub-cell strings and the second sub-cell strings that are alternately arranged along the preset direction, wherein the first sub-cell strings and the second sub-cell strings are aligned in the preset direction; and moving the first sub-cell strings relative to the second sub-cell strings in the first direction such that the second sub-cell strings are offset by the first offset amount relative to the first sub-cell strings in the second direction.

11. The method of claim 6, wherein offsetting the second sub-cell strings in the second direction relative to the first sub-cell strings comprises:

forming the first sub-cell strings and the second sub-cell strings that are alternately arranged along the preset direction, wherein the first sub-cell strings and the second sub-cell strings are aligned in the preset direction; and moving the second sub-cell strings in the second direction with respect to the plurality of film strips by a first sub-offset amount and moving the first sub-cell strings in the first direction with respect to the plurality of film strips by a second sub-offset amount, wherein a sum of the first sub-offset amount and the second sub-offset amount is equal to the first offset amount.

12. The method of claim 6, wherein the first offset amount is in a range of 5 mm to 50 mm.

13. The method of claim 3, wherein a first cell to a N-th cell of each cell string of two adjacent cell strings in the plurality of cell strings are sequentially arranged along a first direction, and the two adjacent cell strings are aligned along the preset direction, wherein inserting the plurality of film strips into the plurality of film insertion openings respectively and moving the plurality of cell strings relative to the plurality of film strips comprise:

providing the plurality of film strips, wherein each film strip of the plurality of film strips comprises a first portion and a second portion that are arranged along the first direction, the first portion and the second portion both extending along the preset direction;

inserting the second portion into a corresponding film insertion opening of a corresponding cell string in the plurality of cell strings, with the first portion exposed outside the corresponding film insertion opening in the plurality of cell strings; and moving the plurality of cell strings in a second direction relative to the plurality of film strips such that at least a part of the first portion is inserted into the corresponding film insertion opening of the corresponding cell string in the plurality of cell strings.

14. The method of claim 3, wherein the remaining part of the respective film strip being at least partially inserted into the corresponding film insertion opening comprises:

inserting the whole remaining part of the respective film strip into the corresponding film insertion opening; or inserting partially the remaining part of the respective film strip into the corresponding film insertion opening.

15. The method of claim 3, wherein after moving the plurality of cell strings relative to the plurality of film strips, an orthographic projection of the respective film strip on the respective cell coincides with the corresponding overlapping welding region.

16. The method of claim 1, wherein closing the corresponding film insertion opening comprises:

moving the end portion of the respective cell and the end portion of the adjacent cell in directions toward each other to close the corresponding film insertion opening, wherein the respective film strip is positioned between the respective cell and the adjacent cell.

17. The method of claim 1, wherein an opening angle of the corresponding film insertion opening is in a range of 15° to 30°, wherein the opening angle of the corresponding film insertion opening refers to an angle between the end portion of the respective cell and the end portion of the adjacent cell.

18. The method of claim 17, wherein the opening angle of the corresponding film insertion opening is kept unchanged before closing the corresponding film insertion opening.

19. The method of claim 1, wherein during inserting of the part of the respective film strip into the corresponding film insertion opening, a ratio of a width of the part of the respective film strip inserted into the corresponding film insertion opening to a width of the remaining part of the respective film strip is in a range of 1.5:1 to 5:1.

20. The method of claim 6, wherein the first displacement amount is not equal to the second displacement amount.

* * * * *